United States Patent
Kao et al.

(10) Patent No.: US 11,751,339 B2
(45) Date of Patent: Sep. 5, 2023

(54) ELECTRONIC-COMPONENT CARRIER BOARD AND A WIRING METHOD FOR THE SAME

(71) Applicant: GLOBAL MASTER TECH. CO., LTD., Kaohsiung (TW)

(72) Inventors: Yao-Hua Kao, Kaohsiung (TW); Chieh-Chien Chen, New Taipei (TW)

(73) Assignee: GLOBAL MASTER TECH. CO., LTD., Kaohsiung (TW)

(*) Notice: Subject to any disclaimer, the term of this patent is extended or adjusted under 35 U.S.C. 154(b) by 0 days.

(21) Appl. No.: 17/449,032

(22) Filed: Sep. 27, 2021

(65) Prior Publication Data
US 2022/0377909 A1 Nov. 24, 2022

(30) Foreign Application Priority Data

May 24, 2021 (TW) ................. 110118665

(51) Int. Cl.
*H05K 1/02* (2006.01)
*H05K 3/34* (2006.01)
(Continued)

(52) U.S. Cl.
CPC ......... *H05K 3/3447* (2013.01); *B23K 1/0016* (2013.01); *H05K 1/0251* (2013.01);
(Continued)

(58) Field of Classification Search
CPC .......... H05K 3/3447; H05K 2201/096; H05K 2201/09545; H05K 1/0298; H05K 1/115; B23K 1/0016; B23K 2101/42
See application file for complete search history.

(56) References Cited

U.S. PATENT DOCUMENTS 3,151,923 A * 10/1964 Bell ............... H04Q 1/142
439/48
3,214,827 A * 11/1965 Prohofsky ........... H01R 12/523
228/180.1
(Continued)

FOREIGN PATENT DOCUMENTS

CN 101662882 A 3/2010
TW 200533253 A 10/2005
(Continued)

OTHER PUBLICATIONS

Search Report appended to an Office Action, which was issued to Taiwanese counterpart application No. 110118665 by the TIPO dated May 5, 2022, with an English translation thereof.

*Primary Examiner* — Steven T Sawyer
(74) *Attorney, Agent, or Firm* — MLO, a professional corp.

(57) ABSTRACT

An electronic-component carrier board includes carrier plates formed in a stack, and insulating layers each disposed between two adjacent ones of the carrier plates. Multiple conductive pins extend through the insulating layers and the carrier plates. Multiple conductive wires equal in length and width are provided. Each conductive wire is connected to one of the conductive pins, covered by one of the insulating layers, disposed between two adjacent ones of the carrier plates, and extends outwardly from the stack of the carrier plates. A wiring method for the electronic-component carrier board is also disclosed.

2 Claims, 6 Drawing Sheets

(51) Int. Cl.
*H05K 1/11* (2006.01)
*B23K 1/00* (2006.01)
*B23K 101/42* (2006.01)

(52) U.S. Cl.
CPC ........... *H05K 1/0298* (2013.01); *H05K 1/115* (2013.01); *B23K 2101/42* (2018.08); *H05K 2201/096* (2013.01); *H05K 2201/09545* (2013.01); *H05K 2201/10704* (2013.01)

(56) References Cited

U.S. PATENT DOCUMENTS

| | | | | |
|---|---|---|---|---|
| 3,346,773 A * | 10/1967 | Lomerson | ............ | H05K 3/3447 361/792 |
| 3,660,726 A * | 5/1972 | Ammon | ............... | H05K 3/4623 174/265 |
| 4,290,195 A * | 9/1981 | Rippere | ............... | H05K 3/4069 427/97.8 |
| 5,544,004 A * | 8/1996 | Inagaki | .................. | H02B 1/207 439/43 |
| 5,574,630 A * | 11/1996 | Kresge | ................ | H01L 23/5384 257/E23.079 |
| 5,929,375 A * | 7/1999 | Glovatsky | ............ | H05K 1/0207 174/359 |
| 5,975,913 A * | 11/1999 | Wada | ..................... | H04Q 1/145 439/46 |
| 6,000,126 A * | 12/1999 | Pai | ......................... | H05K 3/303 29/423 |
| 6,265,842 B1* | 7/2001 | Hard | .................... | H01R 12/523 439/46 |
| 6,494,722 B1* | 12/2002 | Sakamoto | ............ | B60R 16/0207 439/724 |
| 2002/0007967 A1* | 1/2002 | Yamanashi | ............ | H01R 12/78 174/262 |

FOREIGN PATENT DOCUMENTS

| | | |
|---|---|---|
| TW | 201225749 A | 6/2012 |
| TW | 201929623 A | 7/2019 |

\* cited by examiner

ELECTRONIC-COMPONENT CARRIER BOARD AND A WIRING METHOD FOR THE SAME

CROSS-REFERENCE TO RELATED APPLICATION

This application claims priority to Taiwanese Patent Application No. 110118665, filed on May 24, 2021.

FIELD

The disclosure relates to an electronic-component carrier and a wiring method for the same.

BACKGROUND

The printed circuit board is indispensable for carrying electronic components and conducting circuits. A wiring process of the printed circuit board consists of printing a conductive copper foil on one or both sides of a plastic board according to a desired circuit. When the printed circuit board is a double-layer board, two sides of the plastic board are respectively printed with copper foil traces, and vias are formed to extend through the two sides so that the copper foil traces on the two sides can be interconnected. As various electronic components are installed on the printed circuit board, the copper foil traces connect the electronic components to form a complete circuit.

With development of technology, a demand for multilayer printed circuit boards increases. For making the multilayer printed circuit board, multiple panels and multiple insulating plastic layers are first prepared. Each panel has copper foil circuit traces and is drilled. The panels and the insulating plates are stacked alternately. After the panels and insulating plastic layers are pressed and bonded together, the holes drilled in the panels interconnect each other to form through holes, blind vias, and buried vias, all of which are copper electroplated to interconnect the copper foil circuit traces of the panels. However, as the lengths and widths of the copper foil circuit traces are unequal, when the copper foil circuit traces are connected to electronic components or connectors, impedance irregularities occur during transmission of signals and will be more severe during high frequency transmission.

SUMMARY

An object of the disclosure is to provide an electronic-component carrier board that can avoid impedance irregularities to increase transmission signal accuracy.

According to the object of the disclosure, an electronic-component carrier board includes a plurality of carrier plates, a plurality of insulating layers, a plurality of conductive pins, and a plurality of conductive wires.

The carrier plates are disposed one on the other to form a stack. Each of the carrier plates has a top surface, a bottom surface, and a plurality of plated through holes extending through the top and bottom surfaces. The plated through holes of the carrier plates are respectively aligned and communicated with each other to form a plurality of insertion passages.

Each of the insulating layers is disposed between two adjacent ones of the carrier plates.

The conductive pins extend through the insulating layers and are respectively inserted through the insertion passages of the carrier plates in such a manner that each of said conductive pins is exposed from one of the insertion passages.

The conductive wires are equal in length and width. Each of the conductive wires is laid on and extends along at least one of the top and bottom surfaces of one of the carrier plates, is connected to an outer peripheral surface of one of the conductive pins on the at least one of the top and bottom surfaces of the one of the carrier plates, is covered by one of the insulating layers, is disposed between two adjacent ones of the carrier plates, and extends outwardly from the stack of the carrier plates.

Another object of the disclosure is to provide a wiring method for an electronic-component board.

Accordingly, a wiring method for an electronic-component carrier board includes:

(a) preparing a first carrier plate having a plurality of plated through holes;

(b) providing a plurality of conductive pins, and inserting each of the conductive pins through one of the plated through holes of the first carrier plate in such a manner that each of the conductive pins extends out of the respective one of the plated through holes;

(c) providing a set of conductive wires and connecting one end of each of the conductive wires to a peripheral surface of one of the conductive pins, the conductive wires being equal in length and width, each of the conductive wires being laid on the first carrier plate;

(d) providing an insulating layer on the first carrier plate to cover the conductive wires;

(e) stacking on the first carrier plate an additional carrier plate having plated through holes as same as the plated through holes of the first carrier plate, and repeating steps (b), (c) and (d) so that each of the conductive pins is inserted through one of the plated through holes of the additional carrier plate, so that an additional set of conductive wires are provided, each of which is connected to one of the conductive pins, laid on and extends outwardly from the additional carrier plate, and so that an additional insulating layer covers the additional carrier plate and the additional set of conductive wires;

(f) repeating step (e) until multiple additional carrier plates are stacked on the first carrier plate; and (g) pressing together the first and additional carrier plates and the insulating layers.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
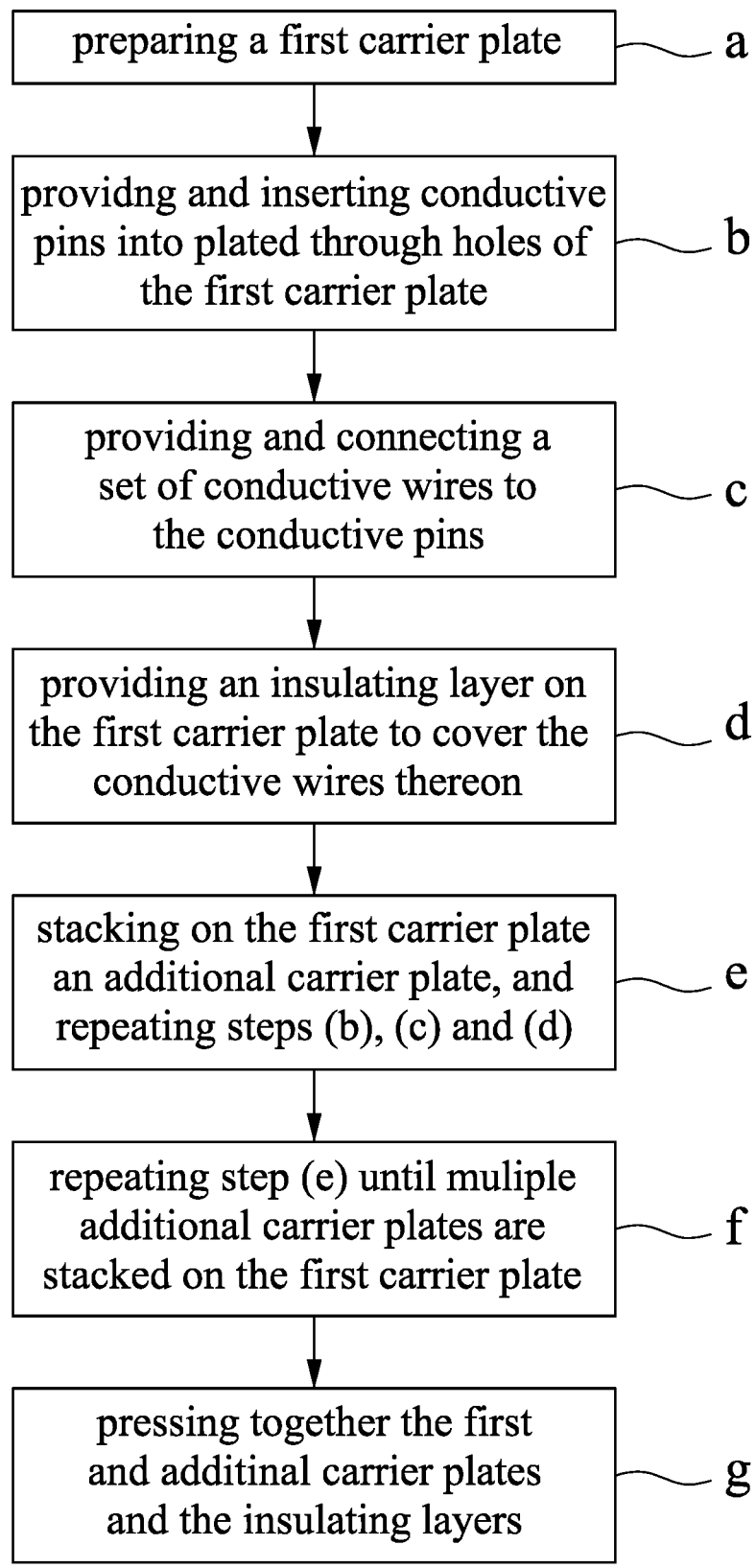
FIG. 1 is a flow chart of a wiring method for an electronic-component carrier board according to an embodiment of the disclosure.
Figure 2:
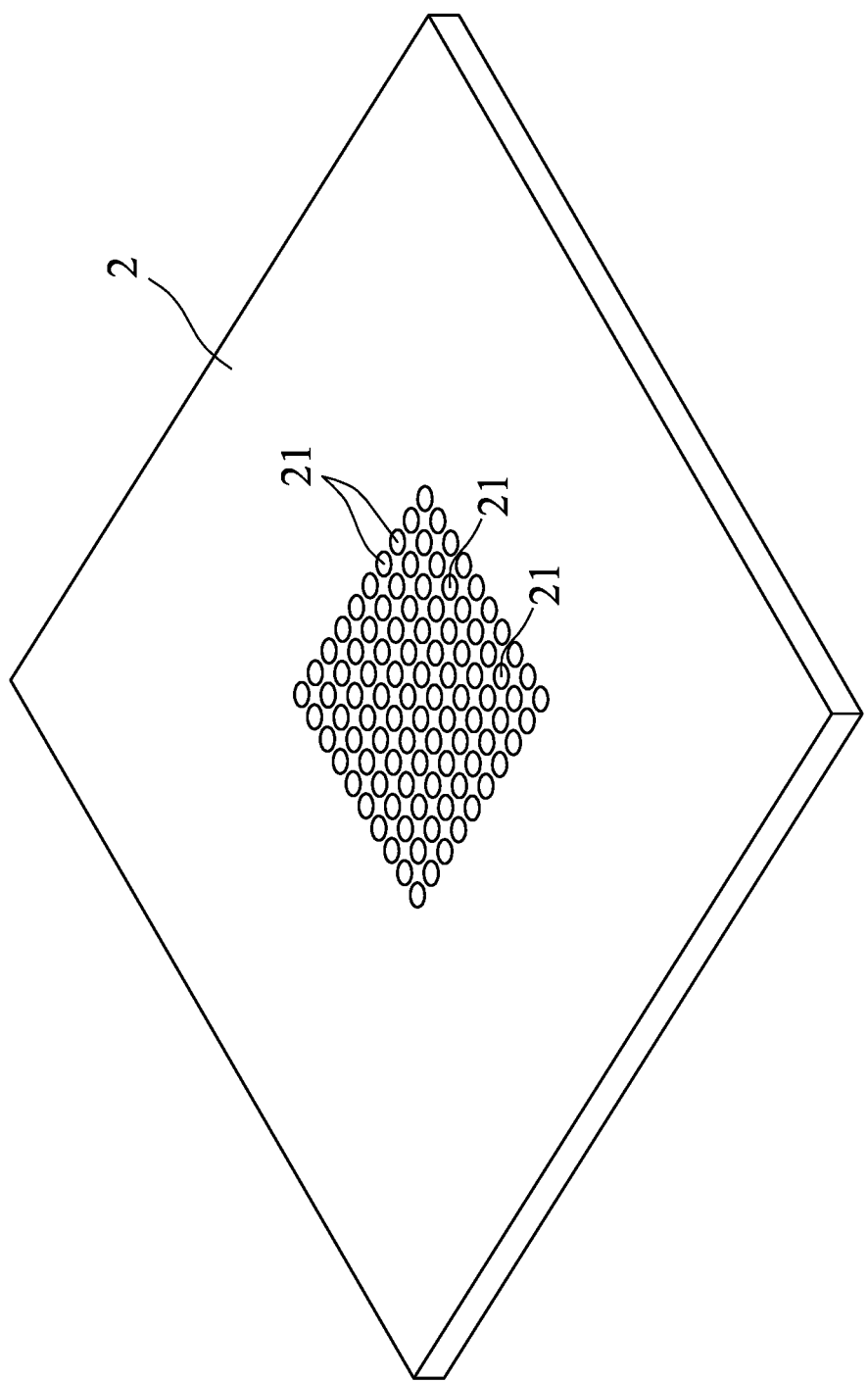
FIG. 2 is a perspective view of the embodiment illustrating a carrier plate prepared by the wiring method.

FIGS. 1 and 2 illustrate a wiring method for an electronic-component carrier board according to an embodiment of the disclosure. The wiring method of the disclosure includes the following steps (a) to (g).

In step (a), a first carrier plate 2 is prepared. The carrier plate 2 has a top surface, a bottom surface, and a plurality of plated through holes 21 extending through the top and bottom surfaces. The carrier plate 2 is a plastic plate or a chipboard. In this embodiment the plated through holes 21 are arranged, but not limited, in a matrix configuration.

Figure 3:
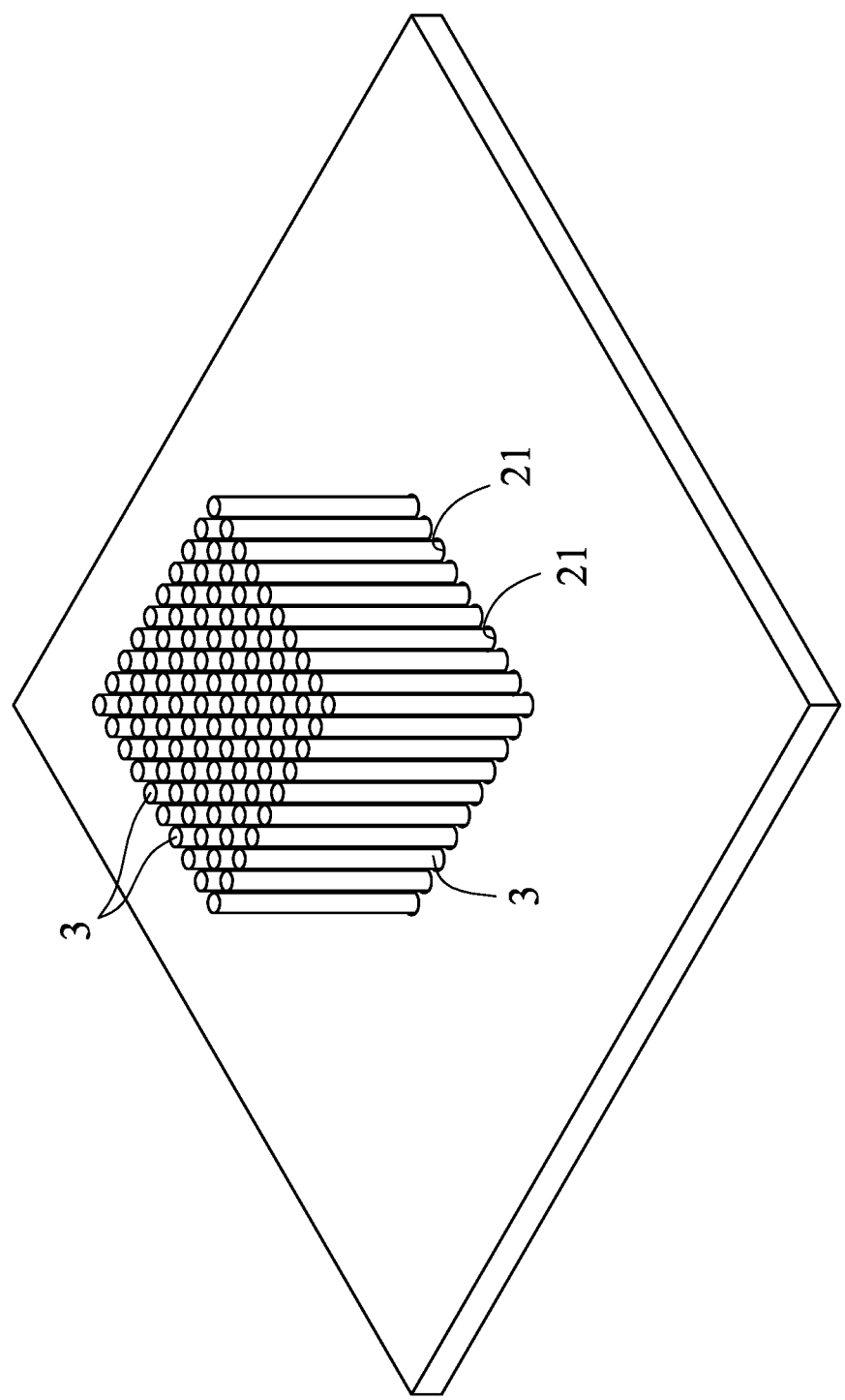
FIG. 3 is a perspective view of the embodiment illustrating conductive pins inserted through the carrier plate.

Referring FIG. 3 in combination with FIG. 1, in step (b), a plurality of conductive pins 3 are provided. Each of the conductive pins 3 is inserted through one of the plated through holes 21 of the first carrier plate 2 in such a manner that each of the conductive pins 3 extends out of the respective one of the plated through holes 21. In this embodiment, the number of the conductive pins is equal to that of the plated through holes 21. However, in other embodiments, the number of the conductive pins 3 may be smaller than that of the plated through holes 21.

Figure 4:
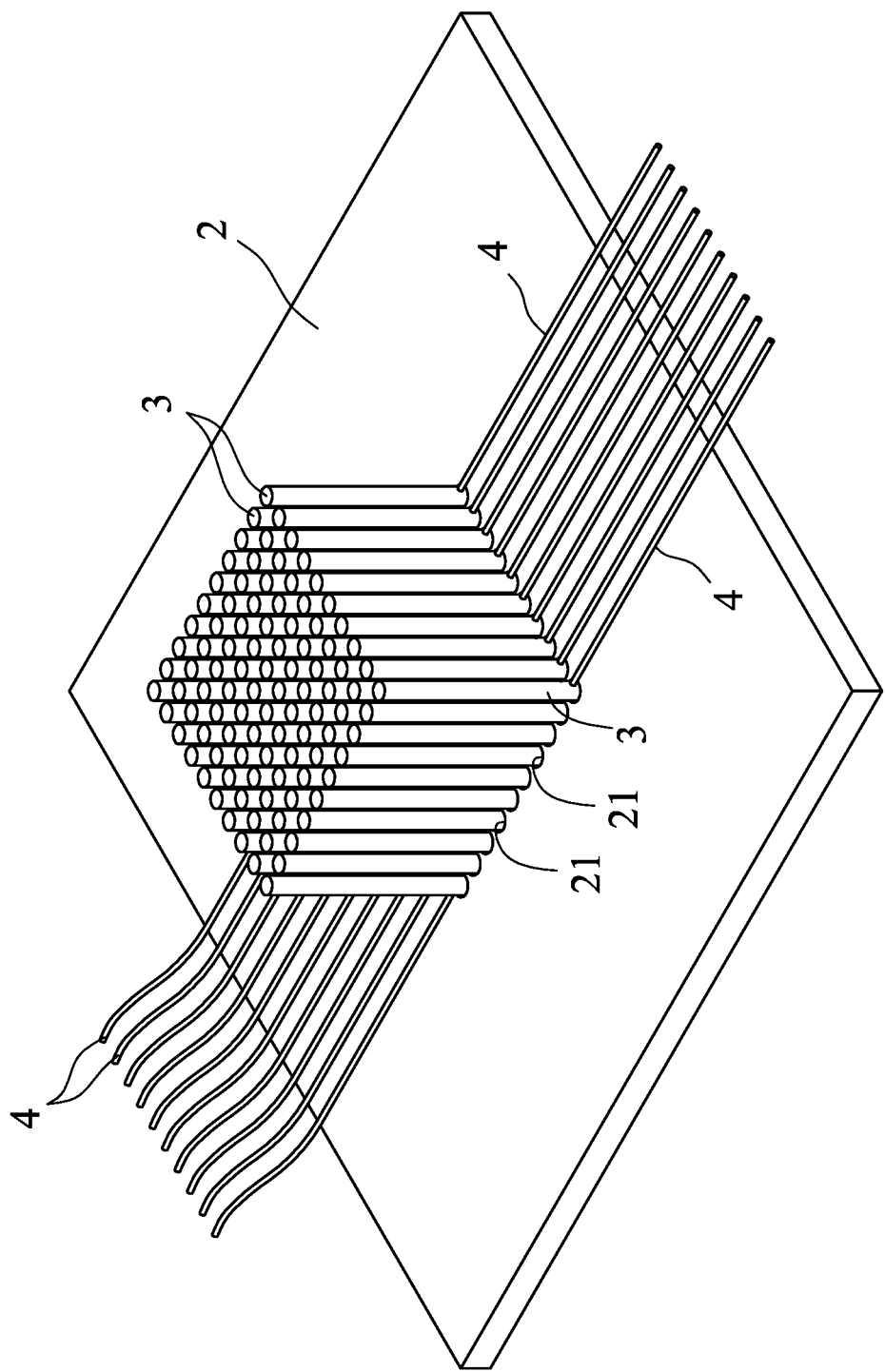
FIG. 4 is a perspective view of the embodiment illustrating conductive wires laid on the carrier plate and connected to the conductive pins.

As shown in FIGS. 1 and 4, in step (c), a set of conductive wires 4 made of copper are provided. One end of each conductive wire 4 is soldered to a peripheral surface of one of the conductive pins 3. The conductive wires 4 are equal in length and width. Each of the conductive wires 4 are laid on and extend along one of top and bottom surfaces of the first carrier plate 2. While the wiring paths shown in FIG. 4 are linear, they should not be limited only thereto. The wiring paths may be nonlinear paths such as curve, or winding paths. Further, the number of the conductive wires 4 may not be equal to that of the conductive pins 3.

Figure 5:
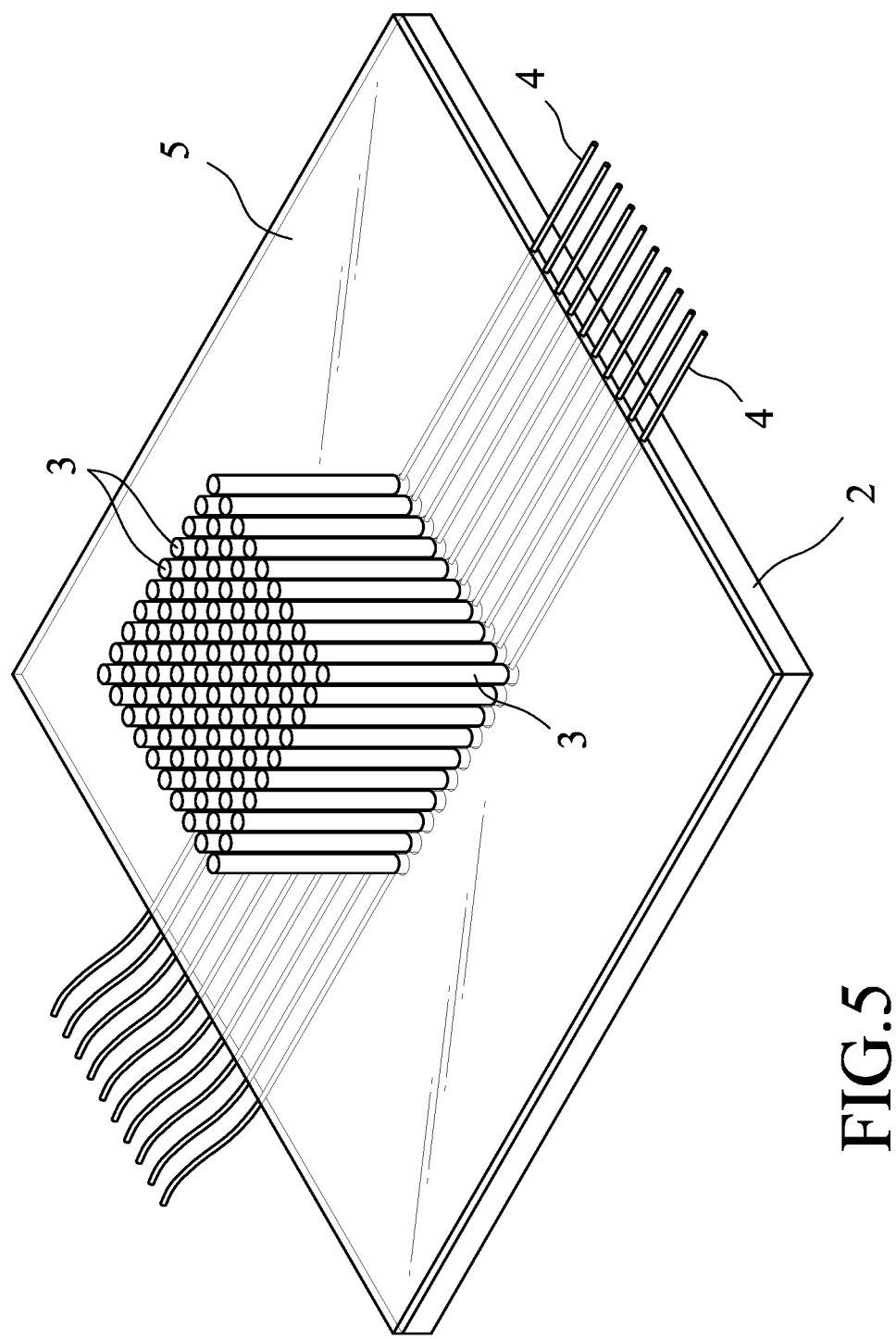
FIG. 5 is a perspective view of the embodiment illustrating an insulating layer covering the conductive wires on the carrier plate.

As shown in FIGS. 1 and 5, in step (d), an insulating layer 5 is provided on the first carrier plate 2 to cover the conductive wires 4.

Figure 6:
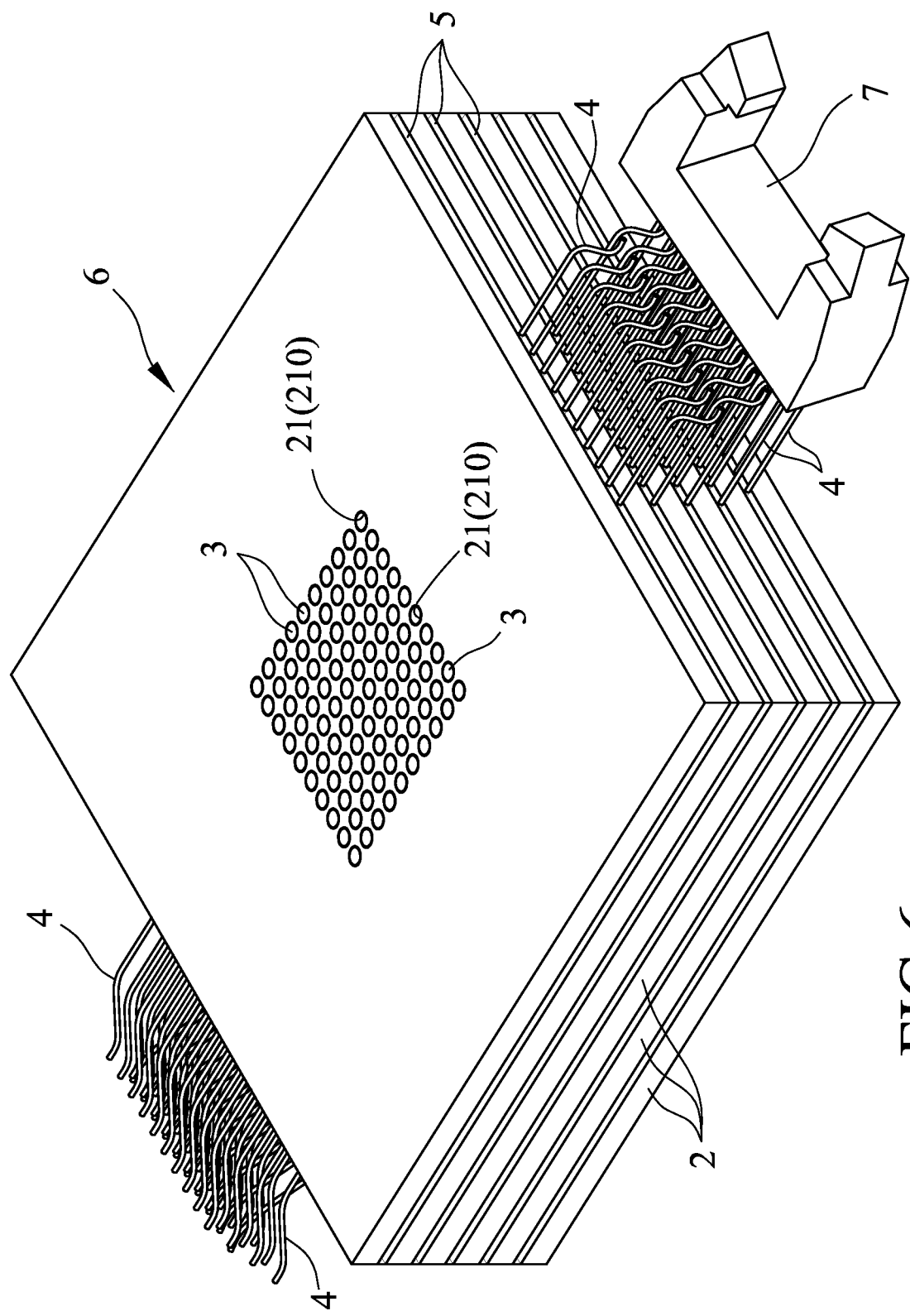
FIG. 6 is a perspective view of an electronic-component carrier board made according to the embodiment of the disclosure.

Referring to FIGS. 1 and 6, in step (e), an additional carrier plate 2 is stacked on the first carrier plate 2. The additional carrier plate 2 has plated through holes 21 as same as the plates through holes 21 of the first carrier plate 2. Subsequently, steps (b), (c) and (d) are repeated so that each of the conductive pins 3 is inserted through one of the plated through holes 21 of the additional carrier plate 2, so that an additional set of conductive wires 4 are provided, each of which is connected to one of the conductive pins 3 and laid on and extends outwardly from the additional carrier plate 2, and so that an additional insulating layer 5 covers the additional carrier plate 2 and the additional set of conductive wires 4.

In step (f), step (e) is repeated until multiple additional carrier plates 2 are stacked on the first carrier plate 2.

Lastly, in step (g), the first and additional carrier plates 2 and the insulating layers 5 are pressed together to form a stack so that an electronic-component carrier board 6 is made. As shown in FIG. 6, in the electronic-component carrier board 6, the plated through holes 21 of the additional and first carrier plates 2 are respectively aligned and communicated with each other to form a plurality of insertion passages 210, and the conductive pins 3 extend through the insulating layers 5 each disposed between two adjacent ones of the carrier plates 2 and are respectively inserted through the insertion passages 210.

In this embodiment, because the conductive wires 4 are equal in length and width and are respectively connected to the outer peripheral surfaces of the conductive pins 3, and because the conductive pins 3 are equal in diameter, it is ensured that transmission along the conductive pins 3 and wires 4 can have equal impedance values, thereby solving the problem of the prior art. As shown in FIG. 6, by virtue of the conductive wires 4 extending outwardly from the stack of the additional and first plates 2 and the layers 5, the terminal portions of the conductive wires 4 can be placed at the same level for coupling with the connectors 7. Further, as the conductive pins 3 are of rigid structure, the durability of the electronic-component carrier plate 6 is enhanced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic-component carrier board, comprising:
a plurality of carrier plates disposed one on the other to form a stack, each of said carrier plates having a top surface, a bottom surface, and a plurality of plated through holes extending through said top and bottom surfaces, said plated through holes of said carrier plates being respectively aligned and communicated with each other to form a plurality of insertion passages;
a plurality of insulating layers each of which is disposed between two adjacent ones of said carrier plates;
a plurality of conductive pins extending through said insulating layers and respectively inserted through said insertion passages of said carrier plates in such a manner that each of said conductive pins is exposed from one of said insertion passages, said conductive pins being equal in diameter, each of said conductive pins being cylindrical in shape, and having an equal diameter along an entire length thereof, each of said conductive pin in whole being electrically conductive; and
a plurality of conductive wires equal in length and width, each of said conductive wires being laid on and extending along at least one of said top and bottom surfaces of one of said carrier plates, being directly connected to an outer peripheral surface of one of said conductive pins on said at least one of said top and bottom surfaces of said one of said carrier plates, being covered by one of said insulating layers, being disposed between two adjacent ones of said carrier plates, and extending outwardly from the stack of said carrier plates.

2. The electronic-component carrier board as claimed in claim 1, wherein each of said conductive wires is soldered to said one of said conductive pins.

\* \* \* \* \*